United States Patent
Kobayashi et al.

(10) Patent No.: US 7,355,398 B2
(45) Date of Patent: Apr. 8, 2008

(54) EXCITING COIL DRIVE CIRCUIT OF MAGNETIC SENSOR

(75) Inventors: Kazuyuki Kobayashi, Midori (JP); Tatsuya Suzuki, Kumagaya (JP); Yasuhiro Kaneta, Isesaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 8 days.

(21) Appl. No.: 11/531,020

(22) Filed: Sep. 12, 2006

(65) Prior Publication Data

US 2007/0057669 A1    Mar. 15, 2007

(30) Foreign Application Priority Data

Sep. 12, 2005  (JP) ............ 2005-264284

(51) Int. Cl.
*G01R 33/04* (2006.01)
(52) U.S. Cl. .................................. 324/253
(58) Field of Classification Search ........ 324/244–253, 324/260–261
See application file for complete search history.

(56) References Cited

U.S. PATENT DOCUMENTS 6,194,897 B1 * 2/2001 Fukunaga .......... 324/255
6,218,831 B1 * 4/2001 Fowler ............. 324/253
6,222,363 B1 * 4/2001 Cripe .............. 324/253
6,268,725 B1 * 7/2001 Vernon et al. ....... 324/253

FOREIGN PATENT DOCUMENTS

| JP | 8-285929 | 11/1996 |
| JP | 2005-61969 | 3/2005 |
| JP | 2005-147947 | 6/2005 |

* cited by examiner

*Primary Examiner*—Jay M Patidar
(74) *Attorney, Agent, or Firm*—SoCal IP Law Group LLP; Steven C. Sereboff

(57) ABSTRACT

An exciting coil drive circuit of a magnetic sensor comprises a D/A converter that receives input of digital data for detecting a magnetic field; a first amplifier that outputs a drive signal P applied to one end of an exciting coil of the magnetic sensor based on the output signal of the D/A converter; and a second amplifier that outputs a drive signal N applied to the other end of the exciting coil based on the output signal of the D/A converter, the drive signal N being an inversion signal of the drive signal P, the drive signal N intersecting with the drive signal P twice or more.

11 Claims, 5 Drawing Sheets

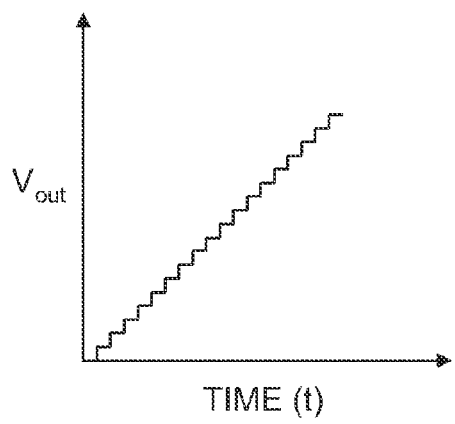
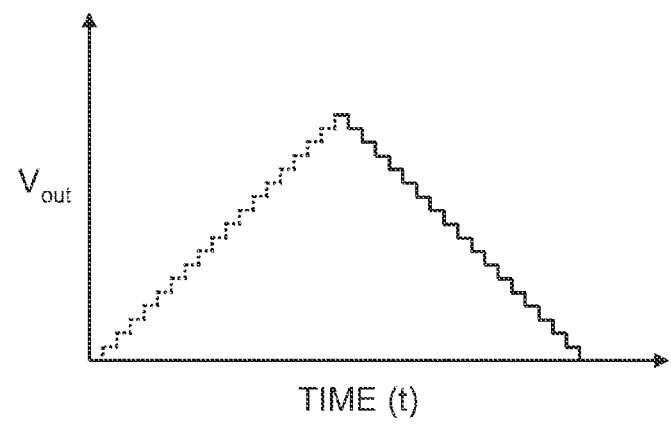
FIG. 6A
FIG. 6B

EXCITING COIL DRIVE CIRCUIT OF MAGNETIC SENSOR

CROSS-REFERENCE TO RELATED APPLICATIONS

The present application claims priority from Japanese Patent Application No. 2005-264284 filed on Sep. 12, 2005, which is herein incorporated by reference.

BACKGROUND OF THE INVENTION

1. Field of the Invention

The present invention relates generally to an exciting coil drive circuit of a magnetic sensor, and more particularly, to technology for providing a highly-accurate and stable exciting coil drive circuit of a magnetic sensor.

2. Description of the Related Art

A so-called flux gate magnetometer is known which saturates a magnetic flux by inputting periodical drive signals to an exciting coil wound on a soft magnetic core to measure intensity of an external magnetic field from saturation time intervals changed depending on the size of the external magnetic field that is measured. The flux gate magnetometer has various excellent features for a magnetometer, such as (1) high sensitivity and magnetic field resolution, (2) capability of measuring a weak magnetic field, (3) a wide measurement range, (4) temperature stability better than magnetometers of other modes, and (5) high linearity to an input magnetic field.

Japanese Patent Application Laid-Open Publication No. 2005-147947 is an example of such a flux gate magnetometer and discloses a flux gate magnetometer with a magnetic sensor that excites a ring core composed of a magnetic detecting material up to a saturated magnetic field area by electrifying an exciting coil with an alternating signal to measure a magnetic flux density using symmetric property of a saturated magnetic flux density induced in the ring core. Japanese Patent Application Laid-Open Publication No. 1996-285929 discloses a magnetometer that supplies an excitation current from an oscillator to an exciting coil at a flux gate formed by winding the exciting coil and a detecting coil on a core to perform synchronous rectification of the output of the detecting coil with a synchronous rectification circuit. Recently, the flux gate magnetometer is expected to be applied to small devices such as a magnetic sensor for a portable compass. Japanese Patent Application Laid-Open Publication No. 2005-61969 discloses a flux gate magnetometer for accomplishing further improvement in accuracy in measurement of a magnetic force.

High accuracy and stability are required for a drive circuit driving an exciting coil of a magnetic sensor used in the flux gate magnetometer. For example, when the magnetic field measurement is performed in a plurality of spatial axis directions, a plurality of flux gate magnetometers is often used at the same time and, therefore, manufacturing variations must be reduced in each flux gate magnetometer in the case of mass production. When applying to small devices, a smaller component count is required and a chip area must not be occupied at the time of integration.

SUMMARY OF THE INVENTION

The present invention was conceived in consideration of such circumstances and it is therefore one object of the present invention to provide a highly-accurate and stable exciting coil drive circuit of a magnetic sensor having fewer manufacturing variations, which can be miniaturized.

In order to achieve the above and other objects, according to an aspect of the present invention there is provided an exciting coil drive circuit of a magnetic sensor, comprising a D/A converter that receives input of digital data for detecting a magnetic field; a first amplifier that outputs a drive signal P applied to one end of an exciting coil of the magnetic sensor based on the output signal of the D/A converter; and a second amplifier that outputs a drive signal N applied to the other end of the exciting coil based on the output signal of the D/A converter, the drive signal N being an inversion signal of the drive signal P, the drive signal N intersecting with the drive signal P twice or more.

Since the exciting coil drive circuit of the magnetic sensor is digitally constituted by using the D/A converter, the drive circuit can be achieved which is less affected by external factors such as temperature changes. Therefore, the highly-accurate and stable drive signal can be generated. The manufacturing variations can be constrained at the time of mass production.

In order to achieve the above and other objects, according to another aspect of the present invention there is provided an exciting coil drive circuit of a magnetic sensor, comprising an SC integrator that receives input of digital data for detecting a magnetic field; a first amplifier that outputs a drive signal P applied to one end of an exciting coil of the magnetic sensor based on the output signal of the SC integrator; and a second amplifier that outputs a drive signal N applied to the other end of the exciting coil based on the output signal of the SC integrator, the drive signal N being an inversion signal of the drive signal P, the drive signal N intersecting with the drive signal P twice or more.

Since the exciting coil is selected by the switch for the application of the drive signals, a plurality of the exciting coils can be driven by the same exciting coil drive circuit. Therefore, the manufacturing variations can be constrained. Since the exciting coil drive circuit is used in common, the component count and chip area of the drive circuit can be reduced.

The present invention can thus provide a highly-accurate and stable exciting coil drive circuit of a magnetic sensor having fewer manufacturing variations, which can be miniaturized.

BRIEF DESCRIPTION OF THE DRAWINGS

The above and other objects, aspects, features and advantages of the present invention will become more apparent from the following detailed description when taken in conjunction with the accompanying drawings, in which:

FIGS. 6A and 6B show examples of the drive signal generated by the SC integrator 80.

DETAILED DESCRIPTION OF THE INVENTION

Figure 1:
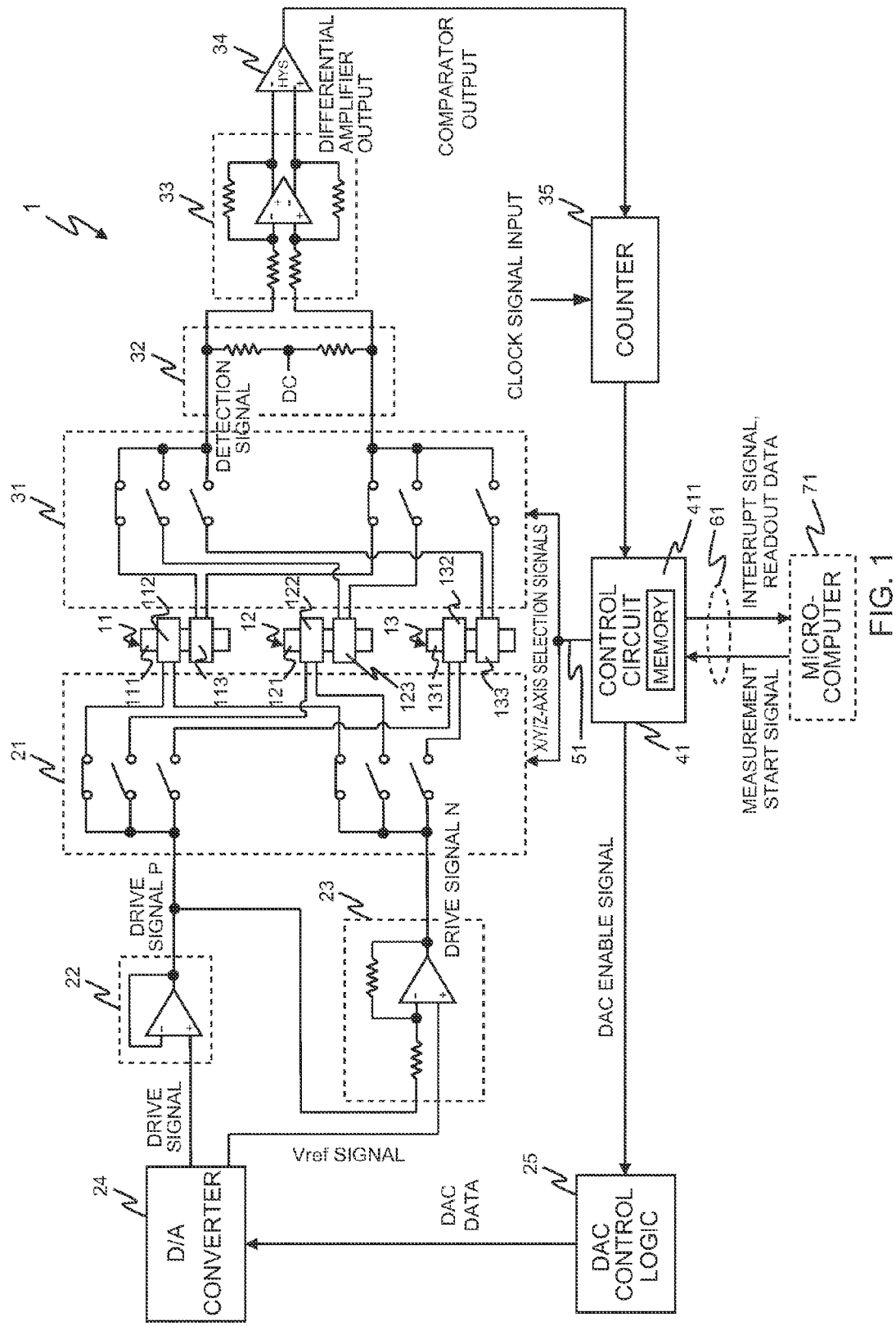
FIG. 1 shows a configuration of the flux gate magnetometer 1 described as one embodiment of the present invention.

An embodiment of the present invention will hereinafter be described in detail. FIG. 1 shows a configuration of a flux gate magnetometer described as one embodiment of the present invention. A flux gate magnetometer shown in FIG. 1 has three magnetic sensors 11, 12, 13 corresponding to the X-axis, Y-axis, and Z-axis, respectively. Each magnetic sensor 11, 12, 13 is constituted by winding an exciting coil 112, 122, 132 and a detecting coil 113, 123, 133 on a magnetic core 111, 121, 131 composed of a soft magnetic material such as a nanocrystal soft magnetic material. The exciting coil 112, 122, 132 is driven by an exciting coil drive circuit constituted by including an excitation switch circuit 21, a noninverting amplifier 22, an inverting amplifier 23, a D/A converter 24, and a control logic that controls the operation of the D/A converter 24 (hereinafter, DAC control logic 25). The output voltage of the detecting coil 113, 123, 133 is processed by a signal detecting circuit constituted by including a detection switch circuit 31, a voltage adjustment circuit 32 that adjusts the output voltage to a predetermined voltage level, a differential amplifier 33 that amplifies the output voltage, a hysteresis comparator 34 that outputs a low level digital signal in a period between two spike voltages included in the output voltage, and a counter 35 that counts the number of pulses of a clock signal in a period when the digital signal output from the hysteresis comparator 34 is in the low level.

A control circuit 41 controls the DAC control logic 25. The control circuit 41 receives and stores a count value input from the counter 35 into an internal memory 411. The control circuit 41 is connected to a control line 51 of the excitation switch circuit 21 and the detection switch circuit 31 and the control circuit 41 controls the opening/closing of the switch 21 and the switch 31 through the control line 51. The control circuit 41 is communicably connected to a microcomputer 71 (external apparatus) via a bus line 61 and transmits the count value stored in the memory 411 to the microcomputer 71 as needed.

Figure 2:
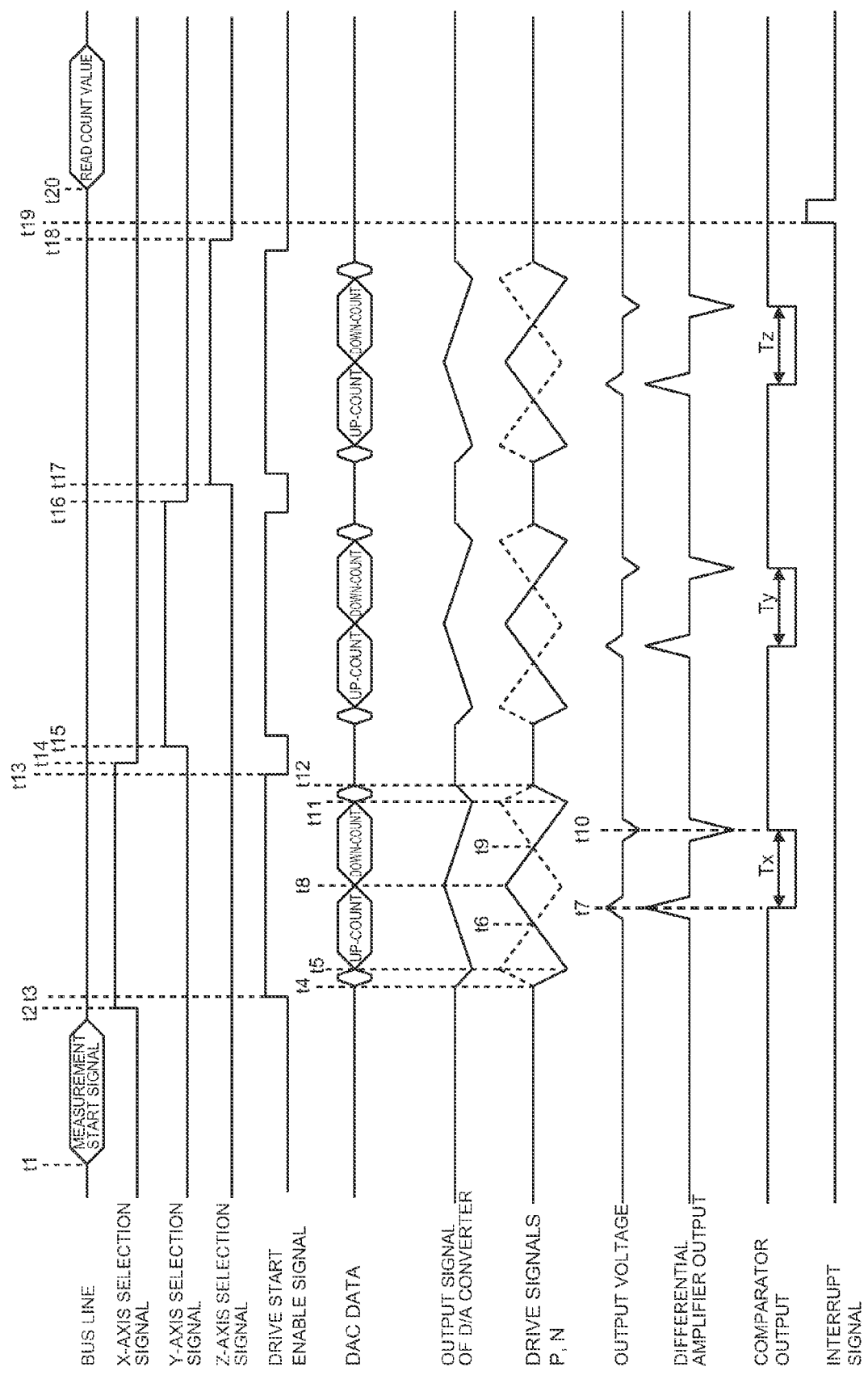
FIG. 2 is a timing chart for describing the operation of the flux gate magnetometer 1 described as one embodiment of the present invention.

FIG. 2 is a timing chart of the operation of the flux gate magnetometer 1 of the embodiment. The operation of the flux gate magnetometer 1 will be described with reference to the timing chart of FIG. 2. In the following description, it is assumed that all the contacts of the excitation switch circuit 21 and the detection switch circuit 31 are opened (turned off) in advance.

As shown in FIG. 2, a measurement start signal is input from the microcomputer 71 to the control circuit 41 via the bus line 61 (t1). When inputting the measurement start signal, the control circuit 41 outputs a signal (hereinafter, x-axis selection signal) for turning on the x-axis contacts of the excitation switch circuit 21 and the detection switch circuit 31 (t2). When inputting the x-axis selection signal, the excitation switch circuit 21 and the detection switch circuit 31 turn on the contacts of the exciting coil 112 and the detecting coil 113 of the magnetic sensor 11 for measuring the magnetic field in the x-axis direction. In this way, the excitation switch circuit 21 selects the exciting coils 112, 122, 132 to which a drive signal P and a drive signal N are applied as described below.

The control circuit 41 then outputs a drive start enable signal to the DAC control logic 25 (t3). When inputting the drive start enable signal to the DAC control logic 25, DAC data are input to the D/A converter 24. Specifically, down-count data are input as the DAC data (t4 to t5). Because of the down-count data, a signal is applied immediately before a step-up period to prevent the exciting coil 112 from generating a high-voltage back electromotive force causing damages of circuit elements such as the noninverting amplifier 22 and the inverting amplifier 23. The DAC control logic 25 then outputs up-count data to the D/A converter 24 for the DAC data (t5). In this way, the D/A converter 24 outputs a signal for a step-up period of a triangular wave (t5 to t8).

The DAC control logic 25 stops the output of the up-count data to the D/A converter 24 at t8 and then outputs the down-count data. In this way, the D/A converter 24 outputs a signal for a step-down period of the triangular wave (t8 to t11). The DAC control logic 25 stops the output of the down-count data to the D/A converter 24 at t11 and then outputs the up-count data. Because of the down-count data, a signal is applied immediately after the step-down period to prevent the exciting coil from generating a high-voltage back electromotive force causing damages of circuit elements such as the noninverting amplifier 22 and the inverting amplifier 23.

A drive signal of the D/A converter 24 is supplied to the noninverting input terminal of the noninverting amplifier 22. A Vref signal of the D/A converter 24 is supplied to the noninverting input terminal of the inverting amplifier 23. The output of the noninverting amplifier 22 is fed back negatively to the inverting input terminal of the noninverting amplifier 22. The output of the noninverting amplifier 22 is input to the inverting input terminal of the inverting amplifier 23. In this way, the noninverting amplifier 22 outputs a signal shown by a solid line of FIG. 2 (hereinafter, drive signal P), which is acquired by amplifying the output signal of the D/A converter 24, and the inverting amplifier 23 outputs a signal shown by a dotted line of FIG. 2 (hereinafter, drive signal N), which is acquired by inverting the oscillation of the drive signal P.

The drive signal P output from the noninverting amplifier 22 is applied to one of two terminals of the exciting coil 112. The drive signal N output from the inverting amplifier 23 is applied to the other of two terminals of the exciting coil 112. Therefore, a difference voltage between the drive signal P and the drive signal N is applied to the exciting coil 112 (hereinafter, this voltage is referred to as an exciting voltage).

As shown in FIG. 2, spike voltages (t7, t10) generated between the terminals of the detecting coil 113 are caused by the electromotive force generated in a non-saturated section of a B-H curve (B: magnetic flux density, H: magnetic field) of the magnetic sensor 11. A time interval (Tx) of two spike voltages at t7 and t10 is changed depending on an external magnetic field ΔH applied to the magnetic sensor 11. That is, information about intensity, etc. of the external magnetic field ΔH can be acquired by measuring the time interval (Tx) of the output of the two spike voltages.

The spike voltages generated in the detecting coil 113 are converted to predetermined voltage levels by the voltage adjustment circuit 32 and are input to the differential amplifier 33 for amplification. The output voltage amplified by the differential amplifier 33 is input to the hysteresis comparator 34.

The hysteresis comparator 34 outputs a digital signal becoming low level in a period defined by adjacent spike voltages included in the output voltage and becoming high level in other periods. In an initial state, the hysteresis comparator 34 outputs the high level. The hysteresis comparator 34 starts the output of the low level at the timing of the input of the spike voltage generated due to the polarity inversion of the exciting voltage at t6 (t7). The hysteresis comparator 34 switches the output to the high level at the timing of the input of the spike voltage generated due to the polarity inversion of the exciting voltage at t9 (t10).

The digital signal output from the hysteresis comparator 34 is input to the counter 35. The clock signal is input to the counter 35, and the counter 35 counts the number of pulses of the clock signal in a period when the digital signal output from the hysteresis comparator 34 is in the low level. When the digital signal becomes high level and the counting of the number of the pulses is terminated, the counter 35 outputs the count value to the control circuit 41. The control circuit 41 stores the input count value to the memory 411.

The control circuit 41 then turns off the drive start enable signal that is input to the DAC control logic 25 (t13). The control circuit 41 stops the input of the X-axis selection signal to the excitation switch circuit 21 and the detection switch circuit 31 (t14). In this way, the contacts are turned off in the exciting coil 112 and the detecting coil 113 of the magnetic sensor 11 for measuring the magnetic field in the x-axis direction.

The control circuit 41 then transmits a signal (hereinafter, Y-axis selection signal) for turning on the Y-axis contacts of the excitation switch circuit 21 and the detection switch circuit 31 (t15). In this way, the process for the Y-axis is started. The process for the Y-axis is performed in a period from t15 to t16 as is the case with the X-axis. The process for the Z-axis is also performed in a period from t17 to t18 as is the case with the X-axis.

When the count value is stored in the memory 411 for each of the X-axis, Y-axis, and Z-axis, the control circuit 41 transmits to the microcomputer 71 an interrupt signal notifying that the writing of the count values is completed (t19). When receiving the interrupt signal, the microcomputer 71 transmits a read request to the control circuit 41. In this way, the microcomputer 71 reads the count value stored in the memory 411 of the control circuit 41 for each of the X-axis, Y-axis, and Z-axis (t 20). The count values read by the microcomputer 71 are utilized for measuring the intensity, etc. of the external magnetic field ΔH.

In the flux gate magnetometer 1 of the embodiment with the configuration described above, the signals for driving the exciting coils 112, 122, 132 are generated with the digital circuits such as the DAC control logic 25 and the D/A converter 24. Therefore, the highly-accurate and stable drive signals are generated which are less affected by the temperature, etc., as compared to the case of using analog circuits. The manufacturing variations are also constrained by using the digital circuits.

In the flux gate magnetometer 1 of the embodiment, a plurality of the exciting coils 112, 122, 132 is driven by the same D/A converter 24. Therefore, the uniform exciting voltage can be applied to each of the exciting coils 112, 122, 132 and variations of the output can be constrained. Since the circuit is used in common, the component count and the chip area can be reduced at the time of integration.

Since the digital circuits are used in the flux gate magnetometer 1 of the embodiment, the lengths of the step-up period (t5 to t8) and the step-down period (t8 to t11) of the drive signal can be matched highly accurately to improve the measurement accuracy. Since some circuits necessary in the case of the analog circuit are not needed which are, for example, circuits measuring the overall lengths of the drive signals for correcting the effects of the measurement intervals of errors included in the time intervals (Tx, Ty, Tz), the small-sized flux gate magnetometer 1 with lower electric power consumption can be achieved.

Since the flux gate magnetometer 1 of the embodiment counts the number of the pulses of the clock signal with the counter 35 to measure the time intervals (Tx, Ty, Tz) of two spike voltages, the measurement can be performed with accuracy higher than the case of using the analog circuits. Although an A/D converter occupying large chip area is generally needed at the time of integration if the analog circuits measure the time intervals (Tx, Ty, Tz), since the counter 35 is a counter 35 occupying small chip area, the small-sized flux gate magnetometer 1 can be achieved.

Although an integrator is needed for improving accuracy of a measurement value and it is difficult to reduce the measurement time in a conventional method of measuring the time intervals (Tx, Ty, Tz) with the use of the combination of phase detection and filters, the measurement can be performed in a short time since the counter 35 is used. This constrains consumption currents as well.

The flux gate magnetometer 1 of the embodiment is less affected by temperature and noises since the output voltage of the detecting coil 113, 123, 133 is digitalized by the hysteresis comparator 33 at an early stage.

In the flux gate magnetometer 1 of the embodiment, since the same differential amplifier 33 and the same hysteresis comparator 34 perform processes for the output voltages of a plurality of the detecting coils 113, 123, 133, variations are reduced in the measurement values of the detecting coils 113, 123, 133. Since the same circuits are used in the processes for the output voltages of the detecting coils 113, 123, 133 in this way, the component count and the chip area can be reduced at the time of integration.

In the flux gate magnetometer 1 of the embodiment, since the differential amplifier 33 is used for amplifying the output voltages, less common-mode noise is mixed. Since the detecting coils 113, 123, and 133 are not grounded, this also prevents the common-mode noise from being mixed.

Although one embodiment of the present invention has been described in detail as above, the description of the embodiment is for the purpose of facilitating the understanding of the present invention and is not intended to limit the present invention. The present invention may be changed and altered without departing from the spirit thereof and the present invention encompasses the equivalents thereof. For example, a low-pass filter may be inserted at the stage after the D/A converter 24 to smooth the drive signal output from the D/A converter 24.

Figure 3:
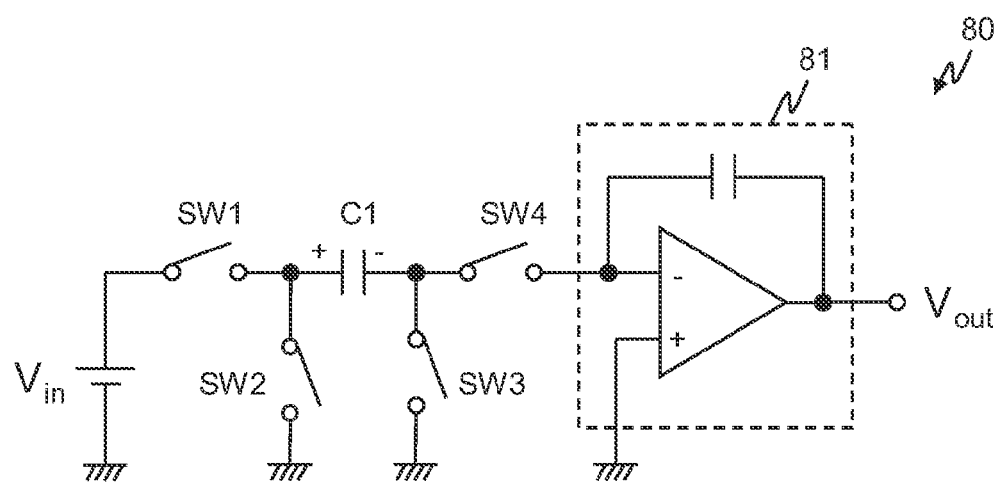
FIG. 3 is shows an example of the SC integrator 80 described as one embodiment of the present invention.

The drive signal may be generated by an SC (switched capacitor) integrator with a configuration shown in FIG. 3 instead of the D/A converter 24. The SC integrator 80 shown in FIG. 3 is constituted by four switches SW1 to SW4, a capacitor C1, and an integration circuit 81 using an operational amplifier. The switch SW1, the capacitor C1, and SW4 are serially connected in this order; SW1 is connected to a direct-current power source Vin; and the output of SW4 is input to the noninverting input terminal of the operational amplifier constituting the integration circuit 81. The switch SW2 is connected between the switch SW1 and the capacitor C1 and one end of the switch SW2 is grounded. The switch SW3 is connected between the capacitor C1 and the switch SW4 and one end of the switch SW3 is grounded.

Figure 4A:
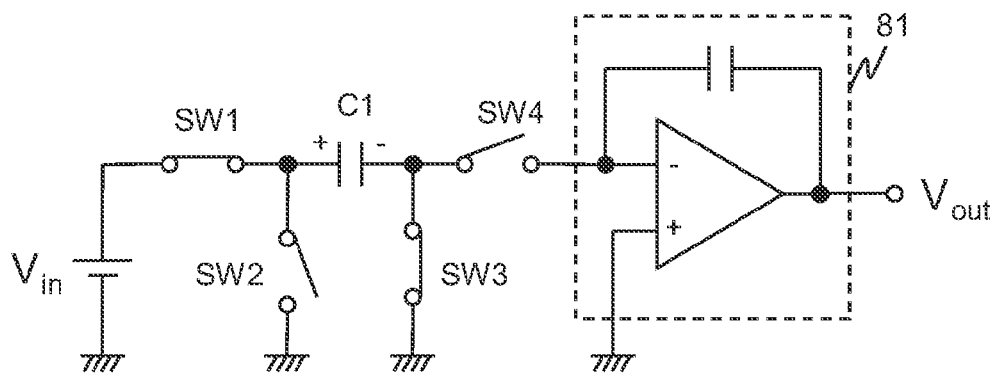
FIGS. 4A and 4B show states of the switches SW1 to SW4 of the SC integrator 80 when generating signals in the step-up period of the drive signal.
Figure 4B:
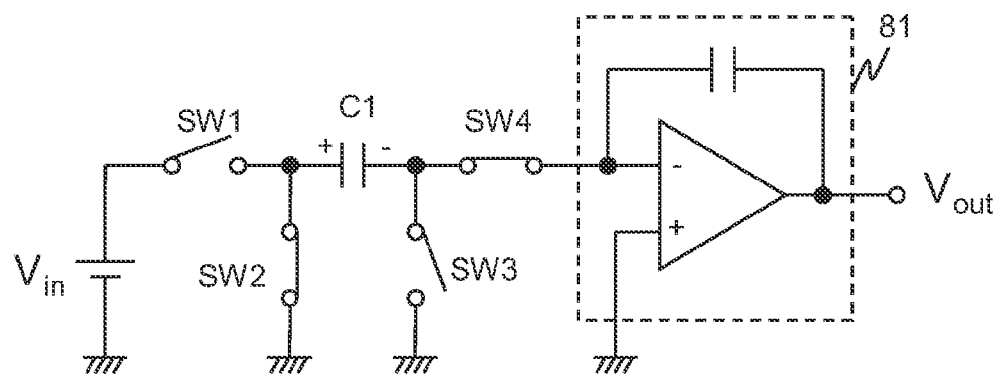
Figure 5A:
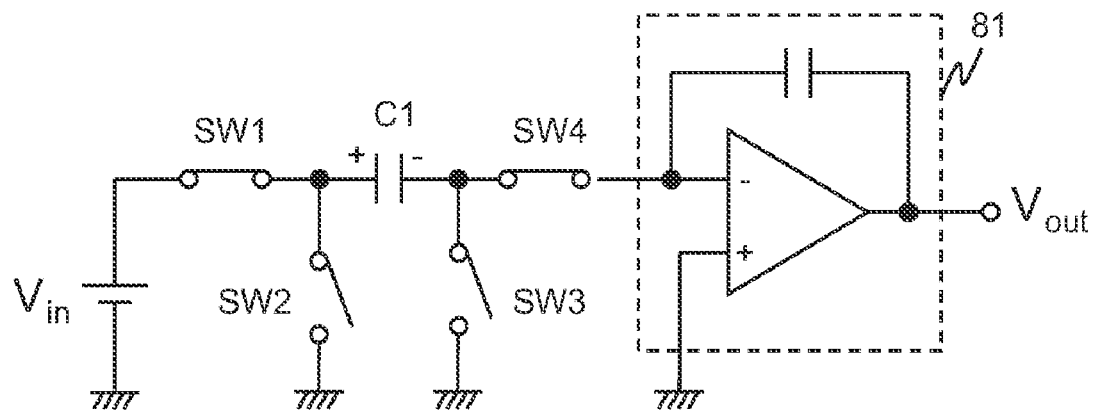
FIGS. 5A and 5B show states of the switches SW1 to SW4 of the SC integrator 80 when generating signals in the step-down period of the drive signal.
Figure 5B:
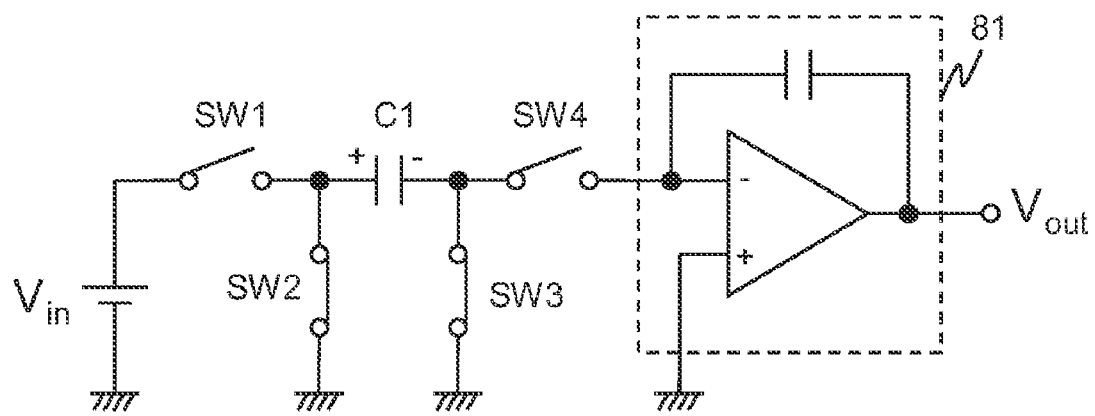

When the SC integrator 80 of FIG. 3 generates signals in the step-up period of the drive signal constituted by a triangular wave, the switches SW1 to SW4 are switched at constant intervals Δt1 such that states shown in FIGS. 4A and 4B are achieved alternately (crawl type driving mode). In this way, as shown in FIG. 6A, a drive signal can be acquired which is pressured up stepwise at constant inclination. When generating signals in the step-down period of the drive signal, the switches SW1 to SW4 are switched at constant intervals Δt2 such that states shown in FIGS. 5A and 5B are achieved alternately (butterfly type driving mode). In this way, as shown in FIG. 6B, a drive signal can be acquired which is pressured down stepwise at constant inclination. A linear drive signal can be acquired by smoothing the drive signal output from the SC integrator 80 through the low-pass filter.

The SC integrator 80 can match Δt1 and Δt2 accurately with the use of known digital circuits and can generate the exact triangular wave with the step-up period and the step-down period having inclinations matched highly accurately. Therefore, when the SC integrator 80 is used, the flux gate magnetometer 1 can also be achieved which can measure a magnetic field highly accurately as is the case with the D/A converter 24.

What is claimed is:

1. An exciting coil drive circuit of a magnetic sensor comprising:
    a D/A converter that receives input of digital data for detecting a magnetic field;
    a first amplifier that outputs a drive signal P applied to one end of an exciting coil of the magnetic sensor based on an output signal of the D/A converter; and
    a second amplifier that outputs a drive signal N applied to the other end of the exciting coil based on an output signal of the D/A converter, the drive signal N being an inversion signal of the drive signal P, the drive signal N intersecting with the drive signal P twice or more.

2. The exciting coil drive circuit of a magnetic sensor of claim 1, comprising:
    a switch circuit that is connected to a plurality of the exciting coils to select the exciting coil to which the drive signal P and the drive signal N are applied.

3. The exciting coil drive circuit of a magnetic sensor of claim 1,
    wherein the output signal of the D/A converter is a triangular wave and
    wherein a DAC control logic is included to output up-count data for generating signals in a step-up period of the triangular wave and down-count data for generating signals in a step-down period of the triangular wave, which are input to the D/A converter.

4. The exciting coil drive circuit of a magnetic sensor of claim 3,
    wherein the D/A control logic outputs to the D/A converter the down-count data for adding a signal for preventing the exciting coil from generating a high-voltage back electromotive force immediately before the step-up period of the output signal of the D/A converter.

5. The exciting coil drive circuit of a magnetic sensor of claim 3,
    wherein the D/A control logic outputs to the D/A converter the up-count data for adding a signal for preventing the exciting coil from generating a high-voltage back electromotive force immediately after the step-down period of the output signal of the D/A converter.

6. The exciting coil drive circuit of a magnetic sensor of claim 3, comprising:
    a control circuit that is connected communicably to an external apparatus and the DAC control logic,
    wherein the control circuit outputs an enable signal to the DAC control logic when a measurement start signal is input from the external apparatus and
    wherein the DAC control logic starts to output the up-count data or the down-count data when the enable signal is being input.

7. The exciting coil drive circuit of a magnetic sensor of claim 6, comprising:
    a switch circuit that is connected to a plurality of the exciting coils to select the exciting coil to which the drive signal P and the drive signal N are applied,
    wherein the control circuit outputs to the switch circuit a selection signal for selecting one of the exciting coils and
    wherein the switch circuit selects the exciting coil to which the drive signal P and the drive signal N are applied depending on the selection signal as input.

8. The exciting coil drive circuit of a magnetic sensor of claim 1,
    wherein the first amplifier is a noninverting amplifier,
    wherein the second amplifier is an inverting amplifier,
    wherein the output signal of the D/A converter is input to a noninverting input terminal of the first amplifier, wherein the first amplifier outputs the drive signal P applied to one end of the exciting coil of the magnetic sensor, and
    wherein the output signal of the D/A converter is input to a noninverting input terminal of the second amplifier, the output of the noninverting amplifier is input to an inverting input terminal of the second amplifier, and the second amplifier outputs the drive signal N applied to one end of the exciting coil.

9. The exciting coil drive circuit of a magnetic sensor of claim 8, comprising:
    a low-pass filter that smoothes the output signal of the D/A converter,
    wherein the output signal is input to each of the noninverting input terminal of the first amplifier and the noninverting input terminal of the second amplifier after the output signal passes through the low-pass filter.

10. An exciting coil drive circuit of a magnetic sensor comprising:
    an SC integrator that receives input of digital data for detecting a magnetic field;
    a first amplifier that outputs a drive signal P applied to one end of an exciting coil of the magnetic sensor based on an output signal of the SC integrator; and
    a second amplifier that outputs a drive signal N applied to the other end of the exciting coil based on an output signal of the SC integrator, the drive signal N being an inversion signal of the drive signal P, the drive signal N intersecting with the drive signal P twice or more.

11. The exciting coil drive circuit of a magnetic sensor of claim 10, comprising:
    a switch circuit that is connected to a plurality of the exciting coils to select the exciting coil to which the drive signal P and the drive signal N are applied.

* * * * *